US009661795B2

(12) United States Patent
Iisaka et al.

(10) Patent No.: US 9,661,795 B2
(45) Date of Patent: May 23, 2017

(54) MOUNTING SYSTEM

(75) Inventors: Jun Iisaka, Nisshin (JP); Toshiya Ito, Nishio (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 312 days.

(21) Appl. No.: 14/414,737

(22) PCT Filed: Jul. 26, 2012

(86) PCT No.: PCT/JP2012/068934
§ 371 (c)(1),
(2), (4) Date: Jan. 14, 2015

(87) PCT Pub. No.: WO2014/016933
PCT Pub. Date: Jan. 30, 2014

(65) Prior Publication Data

US 2015/0181778 A1 Jun. 25, 2015

(51) Int. Cl.

| | |
|---|---|
| ***H05K 13/04*** | (2006.01) |
| ***F21V 17/06*** | (2006.01) |
| ***F21V 19/00*** | (2006.01) |
| ***H05K 13/08*** | (2006.01) |
| *H05K 3/30* | (2006.01) |
| *F21Y 101/00* | (2016.01) |

(52) U.S. Cl.
CPC ............. *H05K 13/04* (2013.01); *F21V 17/06* (2013.01); *F21V 19/003* (2013.01); *H05K 13/08* (2013.01); *F21Y 2101/00* (2013.01); *H05K 3/303* (2013.01); *Y10T 29/53178* (2015.01)

(58) Field of Classification Search
CPC ........... Y10T 29/5313; Y10T 29/53174; Y10T 29/53178; H05K 3/30; H05K 3/303; H05K 13/04; H05K 13/08; F21V 17/06; F21V 19/003; F21Y 2101/00
USPC .......... 29/739, 740, 741, 743, 832, 833, 834
See application file for complete search history.

(56) References Cited

FOREIGN PATENT DOCUMENTS

JP 2007-234701 9/2007

OTHER PUBLICATIONS

International Search Report Issued Aug. 21, 2012 in PCT/JP12/068934 filed Jul. 26, 2012.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A mounting system which mounts an LED element on a board and mounts a lens so as to cover the LED element, in which control devices which control operations of operating machines include an LED element mounting unit which mounts the LED element in a predetermined mounting position, a deviation amount acquisition unit which acquires a deviation amount between a mounting position and the predetermined mounting position of the LED element, a first lens mounting unit which mounts the lens on the board using a position of the LED element mounted on the board as a reference, when the deviation amount is smaller than a threshold value, and a second lens mounting unit which mounts the lens in a preset position on the board, regardless of the position of the LED element mounted on the board, when the deviation amount is equal to or greater than the threshold value.

10 Claims, 7 Drawing Sheets

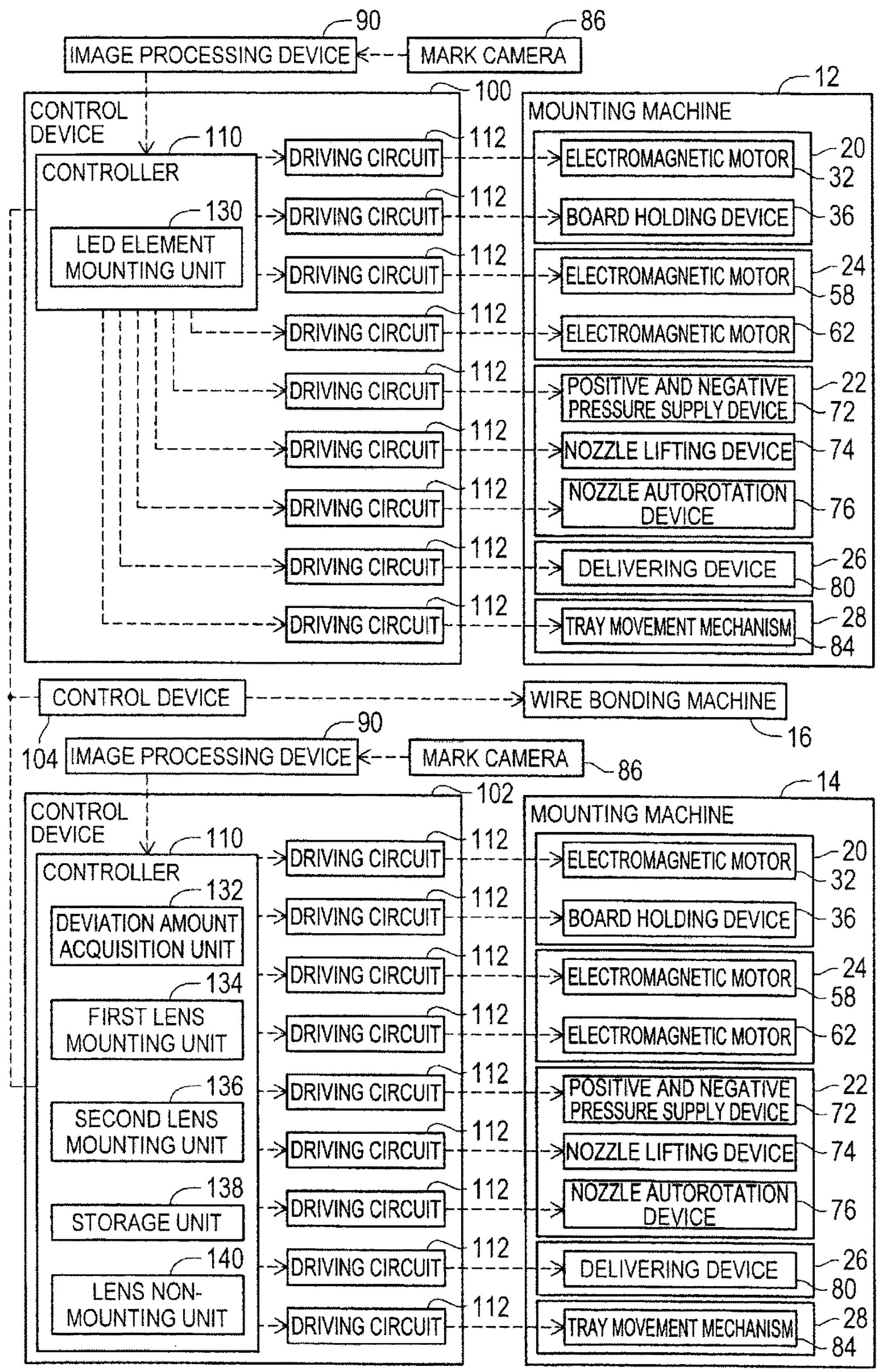
FIG. 3
90
IMAGE PROCESSING DEVICE
86
MARK CAMERA
100
12
CONTROL DEVICE
MOUNTING MACHINE
110
CONTROLLER
130
LED ELEMENT MOUNTING UNIT
112
DRIVING CIRCUIT
ELECTROMAGNETIC MOTOR
BOARD HOLDING DEVICE
POSITIVE AND NEGATIVE PRESSURE SUPPLY DEVICE
NOZZLE LIFTING DEVICE
NOZZLE AUTOROTATION DEVICE
DELIVERING DEVICE
TRAY MOVEMENT MECHANISM
20
32
36
24
58
62
22
72
74
76
26
80
28
84
CONTROL DEVICE
104
WIRE BONDING MACHINE
16
102
14
132
DEVIATION AMOUNT ACQUISITION UNIT
134
FIRST LENS MOUNTING UNIT
136
SECOND LENS MOUNTING UNIT
138
STORAGE UNIT
140
LENS NON-MOUNTING UNIT

MOUNTING SYSTEM

TECHNICAL FIELD

The present disclosure relates to a mounting system which can mount an LED element on a board and can mount a lens so as to cover the LED element.

BACKGROUND ART

In an LED lamp, an LED element is mounted on a board and a lens is mounted on the board so as to cover the LED element. In such an LED lamp, it is desirable to make a light emitting unit of the LED element coincide with an optical axis of the lens, in order to increase luminance. Accordingly, it is considered to acquire a position of the LED element mounted on the board, that is, a position of the LED element relative to a position of the board, and to correct the mounting position of the lens using the mounting position of the LED element as a reference, by using a technology disclosed in PTL 1. As described above, by correcting the mounting position of the lens, the light emitting unit of the LED element can coincide with the optical axis of the lens, and it is possible to manufacture an LED lamp having high luminance.

PTL 1: JP-A-2007-234701

DISCLOSURE

Technical Problem

As described above, by making the light emitting unit of the LED element to coincide with the optical axis of the lens, it is possible to increase illuminance of the LED lamp and to manufacture an LED lamp having high quality. However, when the LED element is mounted in a position which is largely deviated from the preset mounting position, the lens is also mounted in a position which is largely deviated from the preset mounting position, in order to make the light emitting unit of the LED element coincide with the optical axis of the lens. In this case, the lens may protrude from an edge of the board, and the LED lamp having such a lens protruding from an edge of the board, as described above, is a defective product. As described above, when the light emitting unit of the LED element is set to coincide with the optical axis of the lens, in order to manufacture an LED lamp having high quality, the percentage of defect may increase. The disclosure is made in consideration of these circumstances and an object thereof is to provide a mounting system which can manufacture an LED lamp having high quality and decrease the percentage of defect.

Solution to Problem

In order to solve the above-mentioned problems, according to an aspect of the specification, there is provided a mounting system which mounts an LED element on a board and mounts a lens so as to cover the LED element, the system including: one or more board operation execution machines which execute an operation with respect to the board; and a control device which controls the operation of the one or more board operation execution machines, in which the control device includes an LED element mounting unit which mounts the LED element in a predetermined mounting position which is a preset position on the board, a deviation amount acquisition unit which acquires a deviation amount between a mounting position of the LED element mounted by the LED element mounting unit and the predetermined mounting position, a first lens mounting unit which mounts the lens on the board using a position of the LED element mounted on the board as a reference, when the deviation amount is smaller than a threshold value, and a second lens mounting unit which mounts the lens in a preset position on the board, regardless of the position of the LED element mounted on the board, when the deviation amount is equal to or greater than the threshold value.

Further, the control device may include a lens non-mounting unit which does not mount the lens on the board, when the deviation amount is equal to or greater than a second threshold value which is set as a value greater than the threshold value.

The first lens mounting unit can mount the lens on the board based on image data of element position reference marks marked on the LED element.

The first lens mounting unit can also mount the lens on the board based on image data of board position reference marks marked on the board and the deviation amount.

Further, the control device may include a storage unit which separately stores a board on which the lens is mounted by the first lens mounting unit, and a board on which the lens is mounted by the second lens mounting unit.

Advantageous Effects

When the LED element is mounted in a position near the predetermined mounting position, the lens is mounted on the board using the position of the LED element mounted on the board as a reference. Accordingly, it is possible to make a light emitting unit of the LED element coincide with an optical axis of the lens and it is possible to manufacture an LED lamp having high quality. Meanwhile, when the LED element is mounted in a position which is largely deviated from the predetermined mounting position, the lens is mounted in the predetermined mounting position, regardless of the mounting position of the LED element. Accordingly, it is possible to mount the lens on the board so as not to make the lens protrude from the edge of the board, and it is possible to decrease the defect rate. Therefore, according to the mounting system according to claim 1, it is possible to manufacture an LED lamp having high quality and to decrease the defect rate.

When the LED element is mounted to be largely deviated from the predetermined mounting position, the mounting of the lens on the board is prohibited. When the lens is mounted on the board where the LED element is mounted in the position largely deviated from the predetermined mounting position, the lens may come in contact with the LED element. In addition, even when the lens does not come in contact with the LED element, the light emitting unit of the LED element and the optical axis of the lens may be largely deviated and the illuminance may greatly decrease. Therefore, when there are such concerns, by prohibiting the mounting of the lens, it is possible to suppress unnecessary mounting of the lens on the LED lamp which may easily become a defective product.

The lens may be mounted on the board so that the light emitting unit of the LED element coincides with the optical axis of the lens, by referring to the element position reference marks marked on the LED element. Therefore, it is possible to appropriately make the light emitting unit of the LED element coincide with the optical axis of the lens.

The lens may also be mounted on the board so that the light emitting unit of the LED element coincides with the optical axis of the lens, by referring to the board position reference marks marked on the board and the deviation amount of the LED element. That is, even when the element position reference marks are not marked on the LED element, it is possible to appropriately make the light emitting unit of the LED element coincide with the optical axis of the lens.

The LED lamp in which the lens is mounted on the board so that the light emitting unit of the LED element coincides with the optical axis of the lens, and the LED lamp in which the lens is mounted in the predetermined mounting position may be separately stored. Therefore, it is possible to appropriately pick up an LED lamp having high quality.

BRIEF DESCRIPTION OF DRAWINGS

FIG. 3 is a block diagram showing a control device included in each of a plurality of operating machines configuring the mounting system.

BEST MODE FOR CARRYING OUT THE INVENTION

Hereinafter, examples of the invention will be described in detail as embodiments for realizing the invention, with reference to the drawings.

<Configuration of Mounting System>

Figure 1:
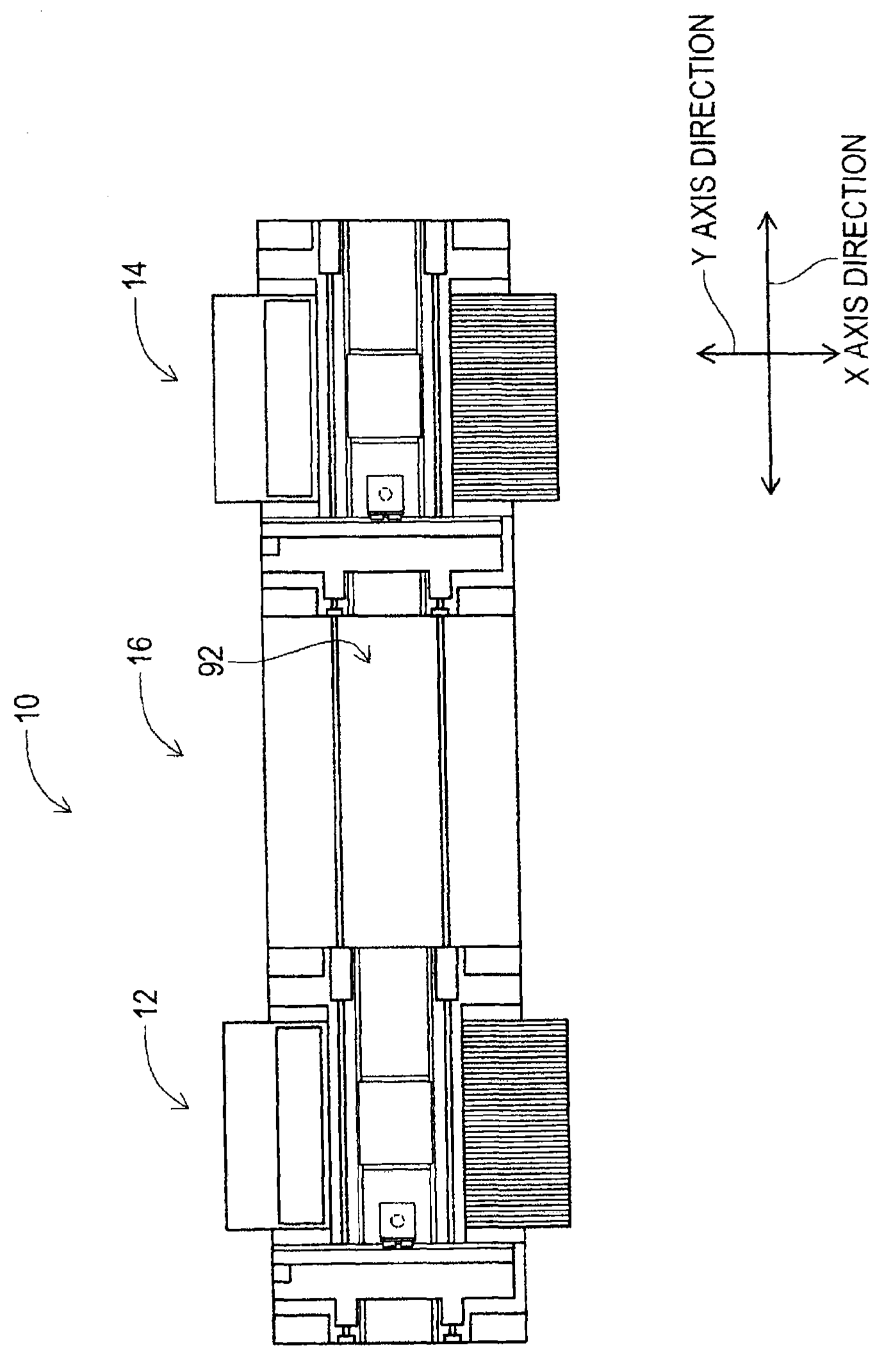
FIG. 1 is a diagram showing a mounting system which is an example of the invention.

FIG. 1 shows a mounting system 10 as an example of the invention. The mounting system 10 is a system for mounting an LED element on a circuit board and mounting a lens. The mounting system 10 is configured with two mounting machines 12 and 14, and a wire bonding machine 16. The wire bonding machine 16 is disposed between the two mounting machines 12 and 14, and the three machines 12, 14, and 16 are arranged in a line. In the following description, a direction in which the three machines 12, 14, and 16 are arranged is referred to as an X axis direction, and a parallel direction orthogonal to the above direction is referred to as a Y axis direction.

Figure 2:
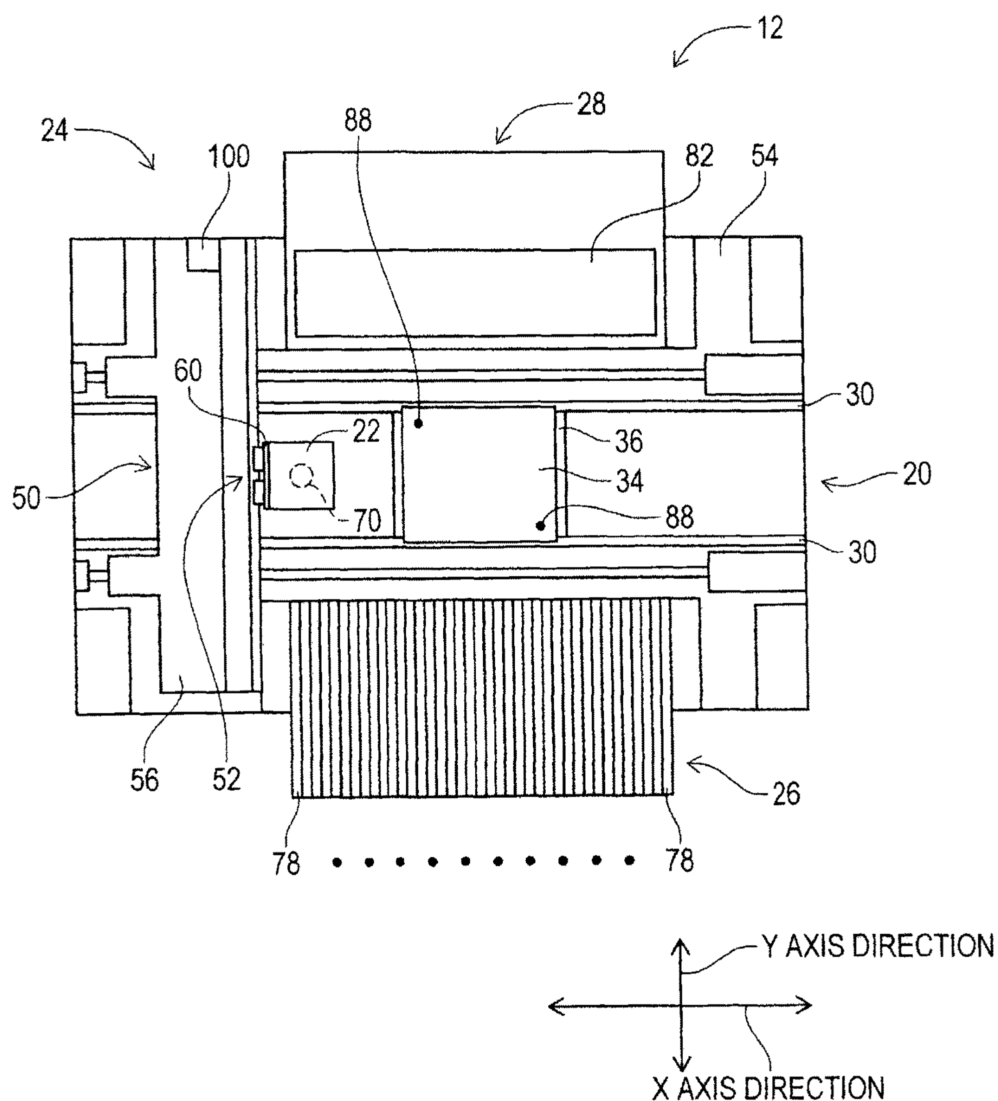
FIG. 2 is a diagram showing a mounting machine included in the mounting system from above.

First, the mounting machines 12 and 14 will be described. Since the two mounting machines 12 and 14 have substantially the same configuration, the mounting machine 12 will be described as a representative configuration. As shown in FIG. 2, the mounting machine 12 includes a transportation device 20, a mounting head 22, a mounting head movement device (hereinafter, may be abbreviated as a "movement device") 24, and a pair of supply devices 26 and 28.

The transportation device 20 includes a pair of conveyor belts 30 which extend in the X axis direction, and an electromagnetic motor (see FIG. 3) 32 which orbits around the conveyor belts 30. A circuit board 34 is supported by the pair of conveyor belts 30 and is transported in the X axis direction by the driving of the electromagnetic motor 32. The transportation device 20 includes a board holding device (see FIG. 3) 36. The board holding device 36 fixedly holds the circuit board 34 supported by the conveyor belts 30 in a predetermined position (position of the circuit board 34 in FIG. 2).

In addition, the movement device 24 is configured with an X axis direction sliding mechanism 50 and a Y axis direction sliding mechanism 52. The X axis direction sliding mechanism 50 includes an X axis slider 56 which is provided on a base 54 to be movable in the X axis direction. The X axis slider 56 is moved to an arbitrary position in the X axis direction by the driving of an electromagnetic motor (see FIG. 3) 58. In addition, the Y axis direction sliding mechanism 52 includes a Y axis slider 60 which is provided at the side of the X axis slider 56 to be movable in the Y axis direction. The Y axis slider 60 is moved to an arbitrary position in the Y axis direction by the driving of an electromagnetic motor (see FIG. 3) 62. The mounting head 22 is attached to the Y axis slider 60. With such a structure, the mounting head 22 is moved to an arbitrary position on the base 54 by the movement device 24.

In addition, the mounting head 22 includes a suction-nozzle 70 provided on a lower end surface thereof. The suction nozzle 70 is connected to a positive and negative pressure supply device (see FIG. 3) 72. Accordingly, the suction nozzle 70 suctions a mounting component to hold using negative pressure, and releases the mounting component using positive pressure. In addition, the mounting head 22 includes a nozzle lifting device (see FIG. 3) 74 which moves the suction nozzle 70 up and down, and a nozzle autorotation device (see FIG. 3) 76 which makes the suction nozzle 70 automatically rotate about a shaft center. Accordingly, a position in a vertical direction and a holding pose of the mounting component held by the suction nozzle 70 are adjusted.

In addition, the pair of supply devices 26 and 28 are arranged on both side portions of the base 54 in the Y axis direction, so as to interpose the transportation device 20 therebetween. One of the pair of supply devices 26 and 28 is a feeder type supply device 26 and the other one thereof is a tray type supply device 28. The feeder type supply device 26 includes a tape feeder 78. The tape feeder 78 accommodates a taped component in a wound state. The taped component is a taped electronic component. The tape feeder 78 delivers the taped component by a delivering device (see FIG. 3) 80. Accordingly, the feeder type supply device 26 supplies the mounting component to a supply position by the delivering of the taped component. Meanwhile, the tray type supply device 28 includes a plurality of component trays 82 on which the mounting component is loaded. An arbitrary tray of the plurality of component trays 82 is moved to the supply position by a tray movement mechanism (see FIG. 3) 84. Accordingly, the tray type supply device 28 supplies the mounting component loaded on the component tray 82 to the supply position.

In addition, the mounting machine 12 includes a mark camera (see FIG. 3) 86. The mark camera 86 is fixed to a lower surface of the Y axis slider 60 in a state of facing downwards, and images a surface of the circuit board 34 or the like in an arbitrary position. Specifically, two board position reference marks 88 are attached to two corners positioned at opposite angles of the circuit board 34, and the mark camera 86 images the two board position reference marks 88. Image data of the two board position reference marks 88 is processed in an image processing device (see FIG. 3) 90. Accordingly, position deviation amounts in the X axis direction and the Y axis direction of the circuit board 34 held by the board holding device 36, and a rotation direction in the XY plane thereof are acquired.

In addition, the wire bonding machine 16 disposed between the two mounting machines 12 and 14 includes a transportation device (see FIG. 1) 92 having the same structure as that of the transportation device 20 of the mounting machines 12 and 14, and a wire bonding operation device (not shown). The wire bonding operation device electrically connects an electrode of the circuit board and an electrode of the mounting component mounted on the circuit board with a wire.

In addition, as shown in FIG. 3, the mounting system 10 includes a plurality of control devices 100, 102, and 104 provided according to the mounting machines 12 and 14 and the wire bonding machine 16. The control devices 100 and 102 provided corresponding to the mounting machines 12 and 14 include a controller 110 and a plurality of driving circuits 112. The plurality of driving circuits 112 are connected to the above-described electromagnetic motors 32, 58, and 62, the board holding device 36, the positive and negative pressure supply device 72, the nozzle lifting device 74, the nozzle autorotation device 76, the delivering device 80, and the tray movement mechanism 84. The controller 110 includes a CPU, a ROM, a RAM, and the like, is configured based on a computer, and is connected to the plurality of driving circuits 112. Accordingly, the operations of the transportation device 20, the movement device 24, and the like are controlled by the controller 110. In addition, the controller 110 is also connected to the image processing device 90 and acquires information relating to the position of the circuit board 34.

In addition, the control device 104 provided corresponding to the wire bonding machine 16 also includes a controller and a driving circuit, but the controller and the driving circuit have the similar configuration as the controller 110 and the driving circuit 112 described above, and therefore the specific description and drawing are omitted. The controllers 110 of the plurality of control devices 100, 102, and 104 are connected to each other, and information or commands are transmitted and received between the controllers 110.

<Control of Mounting System>

With the configurations described above, in the mounting system 10, the LED element is mounted on the circuit board, in the mounting machine 12. In the wire bonding machine 16, a wire bonding process is performed, and in the mounting machine 14, the lens is mounted on the circuit board so as to cover the LED element.

Specifically, in the mounting machine 12, the circuit board 34 is transported to an operation position by the transportation device 20, according to a command of the controller 110 of the control device 100, and the circuit board is held by the board holding device 36 in the operation position. Next, the controller 110 moves the mounting head 22 to the upper portion of the circuit board 34. Then, the board position reference marks 88 attached to the upper portion of the circuit board 34 is imaged by the mark camera 86. The image data is processed by the image processing device 90, and accordingly, positional information of the circuit board 34 is acquired.

Next, the controller 110 moves the mounting head 22 to the supply position by the tape feeder 78 of the supply device 26. The LED element is accommodated in the taped component of the tape feeder 78, and the LED element is supplied to the supply position of the tape feeder 78. The LED element supplied from the tape feeder 78 is suctioned and held by the mounting head 22. Then, the controller moves the mounting head 22 to the upper portion of a predetermined mounting position of the LED element on the circuit board 34. The acquired positional information of the circuit board 34 is used when moving the mounting head 22 to the predetermined mounting position.

Figure 4:
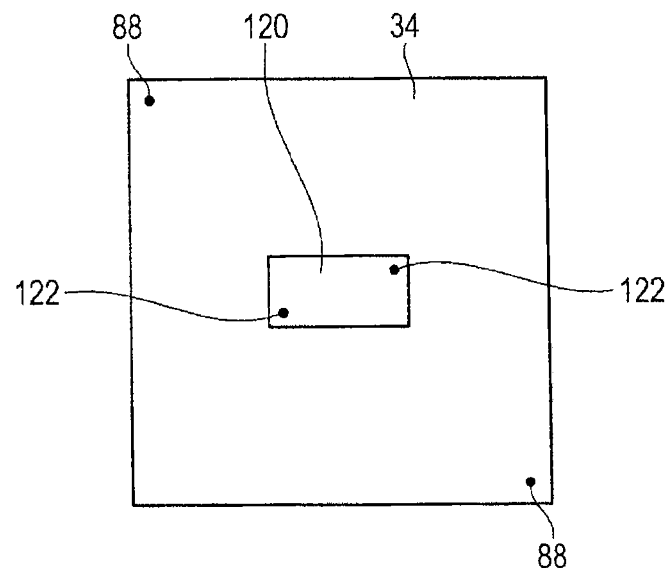
FIG. 4 is a diagram showing a circuit board on which an LED element is mounted.

Next, as shown in FIG. 4, the controller 110 mounts an LED element 120 in the predetermined mounting position. In addition, when mounting the LED element 120, a held pose of the LED element 120 held by the mounting head 22 is adjusted by the nozzle autorotation device 76. The circuit board 34 is transported towards the wire bonding machine 16. In addition, an LED element mounting unit (see FIG. 3) 130 is provided in the controller 110 of the control device 100 of the mounting machine 12, as a function unit for mounting the LED element 120 on the circuit board 34.

In the wire bonding machine 16, the circuit board 34 is transported to the operation position by the transportation device 92, and is held by the board holding device 36 in the operation position. In the operation position, the wire bonding process is performed by the wire bonding operation device. After the wire bonding process is performed, the circuit board 34 is transported towards the mounting machine 14 by the transportation device 92.

In the mounting machine 14, the circuit board 34 is transported to the operation position by the transportation device 20, and is held by the board holding device 36 in the operation position. The controller 110 mounts the lens on the held circuit board 34, but a mounting method of the lens is changed depending on the mounting position of the LED element 120. Specifically, as shown in FIG. 4, two element position reference marks 122 are attached to two corners positioned at opposite angles of the LED element 120. The two element position reference marks 122 are imaged by the mark camera 86, and image data of the two element position reference marks 122 is processed in the image processing device 90. Accordingly, the controller 110 acquires positional information of the LED element 120. In addition, the two board position reference marks 88 of the circuit board 34 are imaged by the mark camera 86, and the image data of the two board position reference marks 88 is processed in the image processing device 90. Accordingly, the controller 110 acquires the positional information of the circuit board 34. A position of the LED element 120 relative to a position of the circuit board 34 is acquired based on the positional information of the circuit board 34 and the positional information of the LED element 120. Accordingly, the controller 110 acquires a deviation amount of an actual mounting position of the LED element 120 and the predetermined mounting position of the LED element 120. In addition, a deviation amount acquisition unit (see FIG. 3) 132 is provided in the controller 110 of the control device 102 of the mounting machine 14, as a function unit for acquiring the deviation amount.

Next, the controller 110 moves the mounting head 22 to the upper portion of the component tray 82 of the supply device 28. The component tray 82 accommodates the lens and the lens is supplied from the component tray 82. The lens supplied from the component tray 82 is suctioned and held by the mounting head 22. Then, the controller 110 moves the mounting head 22 to the upper portion of the circuit board 34. In this case, when the deviation amount is smaller than a threshold value $\alpha$, the controller moves the mounting head 22 to the upper portion of the circuit board 34 so that the center of the LED element 120 mounted on the circuit board 34 and the center of the lens held by the mounting head 22 coincide with each other. In addition, the positional information of the LED element 120 is used when moving the mounting head 22 to the upper portion of the circuit board 34.

Figure 5:
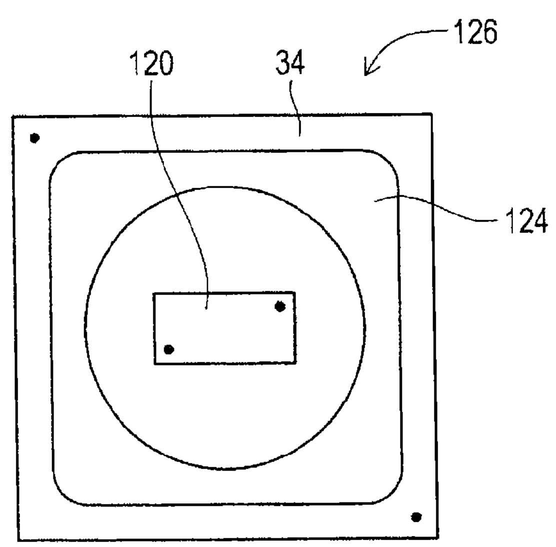
FIG. 5 is a diagram showing an LED lamp in which a lens is mounted on a board so that a light emitting unit of the LED element coincides with an optical axis of the lens.

As shown in FIG. 5, the controller 110 mounts a lens 124 on the circuit board 34. In addition, when mounting the lens 124, a held pose of the lens 124 held by the mounting head 22 is adjusted based on the acquired positional information of the LED element 120. As described above, by mounting the lens 124 on the circuit board 34 using the position of the LED element 120 as a reference, an LED lamp 126 configured with the circuit board 34, the LED element 120, and the lens 124 is manufactured.

A light emitting unit is provided at the center of the LED element 120 and an optical axis passes through the center of the lens 124. Accordingly, in the LED lamp 126 on which the lens 124 is mounted by the method described above, the light emitting unit of the LED element 120 and the optical axis of the lens 124 coincide with each other. Therefore, it is possible to increase illuminance of the LED lamp 126 and it is possible to manufacture the LED lamp 126 having high quality. A first lens mounting unit (see FIG. 3) 134 is provided in the controller 110 of the control device 102 of the mounting machine 14, as a function unit for mounting the lens 124 on the circuit board 34 by the method described above.

Figure 6:
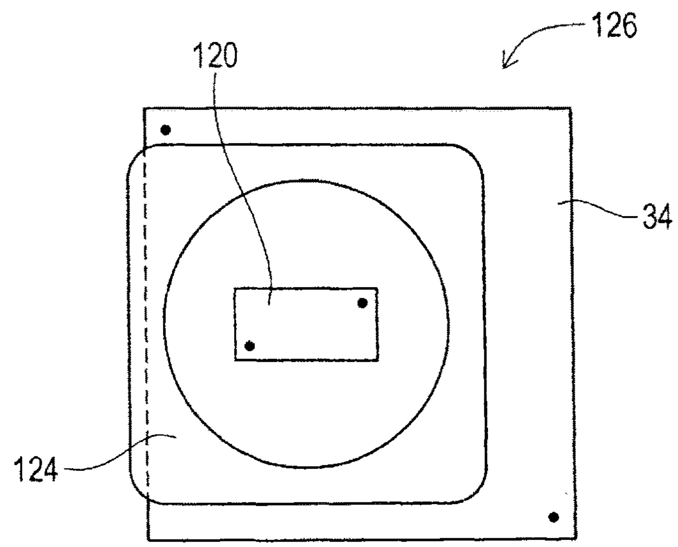
FIG. 6 is a diagram showing an LED lamp in which a lens protrudes from an edge of a circuit board.

However, when the lens 124 is mounted on the circuit board 34 by the method described above in a case where the LED element 120 is mounted to be largely deviated from the predetermined mounting position, the lens 124 may protrude from the edge of the circuit board 34, as shown in FIG. 6. Such an LED lamp 126 is a defective product and is a target of disposal. Accordingly, when the LED element 120 is mounted to be largely deviated from the predetermined mounting position, that is, when the deviation amount is equal to or greater than the threshold value α, the lens 124 is mounted in the preset predetermined mounting position of the circuit board 34 of the lens 124.

Figure 7:
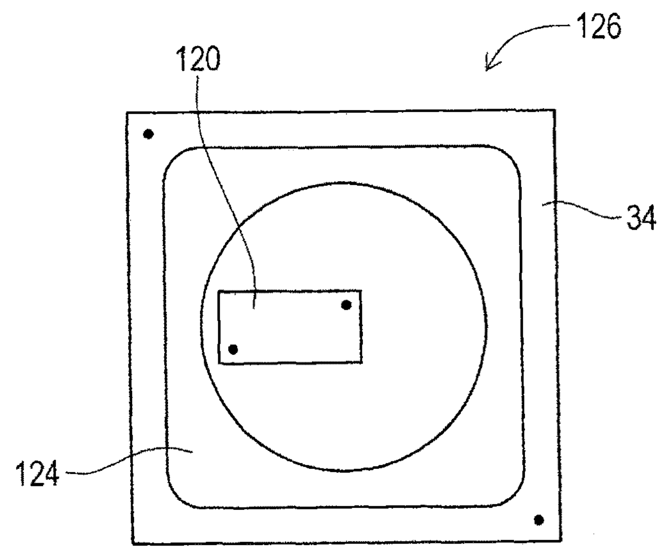
FIG. 7 is a diagram showing an LED lamp in which a lens is mounted in a predetermined mounting position.

Specifically, the controller 110 moves the mounting head 22 to the upper portion of the predetermined mounting position of the lens 124. The positional information of the circuit board 34 is used when moving the mounting head 22 to the upper portion of the predetermined mounting position. As shown in FIG. 7, the lens 124 is mounted on the circuit board 34 by the mounting head 22. In addition, when mounting the lens 124, a held pose of the lens 124 held by the mounting head 22 is adjusted by the nozzle autorotation device 76. Therefore, it is possible to mount the lens 124 on the circuit board 34 so as not to make the lens protrude from the edge of the circuit board 34, and it is possible to decrease the percentage of defect of the LED lamp 126. In addition, a second lens mounting unit (see FIG. 3) 136 is provided in the controller 110 of the control device 102 of the mounting machine 14, as a function unit for mounting the lens 124 on the circuit board 34 by the method described above.

In such a mounting system 10, when it is possible to make the center of the LED element 120 coincide with the center of the lens 124, the LED lamp 126 with the coincided centers thereof is manufactured. Meanwhile, even when the center of the LED element 120 cannot coincide with the center of the lens 124, the LED lamp 126 in which the lens 124 is appropriately mounted on the circuit board 34 is manufactured without manufacturing a defective product. Therefore, both the manufacturing of the LED lamp 126 having high quality and the decrease in the percentage of defect are realized.

In addition, in the mounting system 10, a manufacturing lot of the LED lamp 126 and the mounting method of the lens 124 are stored to be correlated to each other. That is, the LED lamp 126 in which the lens 124 is mounted on the circuit board 34 so that the center of the LED element 120 and the center of the lens 124 coincide with each other (LED lamp 126 shown in FIG. 5) and the LED lamp 126 in which the lens 124 is mounted in the predetermined mounting position of the circuit board 34 (LED lamp 126 shown in FIG. 7) are separately stored. Accordingly, it is possible to suitably pick up the LED lamp 126 having high quality. In addition, a storage unit (see FIG. 3) 138 is provided in the controller 110 of the control device 102 of the mounting machine 14, as a function unit for storing the manufacturing lot of the LED lamp 126 and the mounting method of the lens 124 to be correlated to each other.

In addition, when the LED element 120 is mounted to be largely deviated from the predetermined mounting position, the LED element 120 may come in contact with the lens 124. Further, the center of the LED element 120 may be largely deviated from the center of the lens 124, and accordingly, the illuminance may greatly decrease. Such an LED lamp 126 is a defective product and is a target of disposal. Accordingly, when the deviation amount is equal to or greater than a second threshold value β (>α), the mounting operation of the lens 124 on the circuit board 34 is not performed. Therefore, it is possible to suppress the unnecessary mounting of the lens 124 on the LED lamp 126 which may easily become a defective product. In addition, a lens non-mounting unit (see FIG. 3) 140 is provided in the controller 110 of the control device 102 of the mounting machine 14, as a function unit for not mounting the lens 124 on the circuit board 34.

Modification Examples

Figure 8:
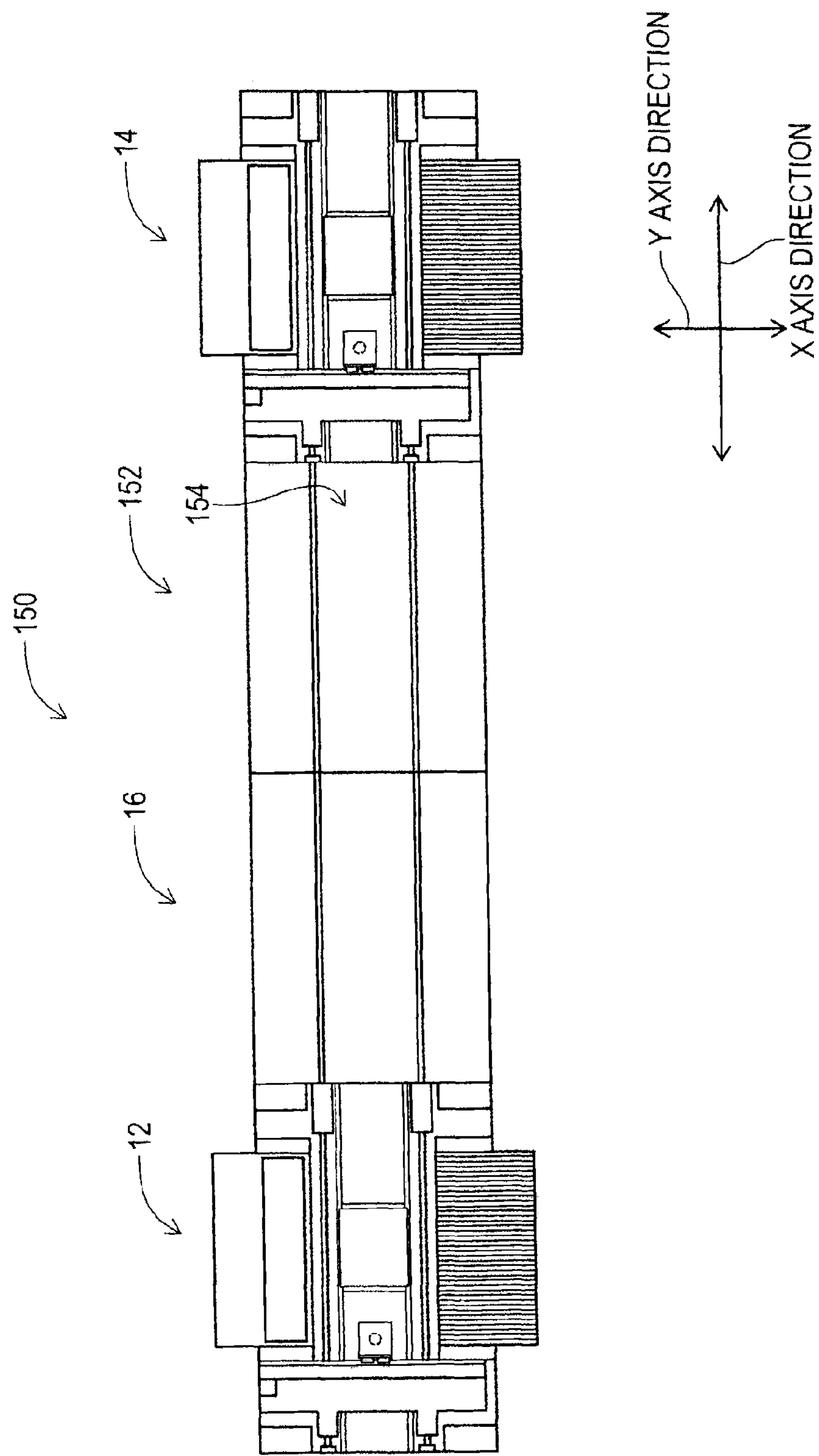
FIG. 8 is a diagram showing a second exemplary mounting system.

In the mounting system 10 of the example described above, the deviation amount of the actual mounting position and the predetermined mounting position of the LED element 120 is detected in the mounting machine 14. However, an operating machine disposed at an upstream side of the mounting machine 14 may acquire the deviation amount, and the mounting machine 14 may acquire the information relating to the deviation amount from the operating machine. The mounting system configured as described above is shown in FIG. 8 as a mounting system 150. The mounting system 150 has the same configuration as that of the mounting system 10 of the example described above, except for an inspection machine 152. Accordingly, a description of the configuration shared by the mounting system 10 described above will be omitted or simply performed with the same reference numerals.

The mounting system 150 is configured with the mounting machines 12 and 14, the wire bonding machine 16, and the inspection machine 152. The inspection machine 152 is disposed between the wire bonding machine 16 and the mounting machine 14, and the four operating machines 12, 14, 16, and 152 are arranged in a line. The inspection machine 152 includes a transportation device 154 having the same structure as that of the transportation device 20 of the mounting machines 12 and 14, and an inspection camera (not shown). The inspection camera images the circuit board 34 on which the LED element 120 is mounted, and a mounting state of the LED element 120 is inspected based on imaged data.

When inspecting the mounting state of the LED element 120 by the inspection machine 152, the mounting position or the like of the LED element 120 is detected, and it is inspected whether or not the LED element 120 is appropriately mounted on the circuit board 34 based on the mounting position or the like. The lens 124 is mounted on the circuit board 34 having the excellent inspection result, by the mounting machine 14, and the LED lamp 126 is manufactured. On the other hand, the lens 124 is not mounted on the circuit board 34 having the negative inspection result, by the mounting machine 14, and the board is discarded or collected.

Figure 9:
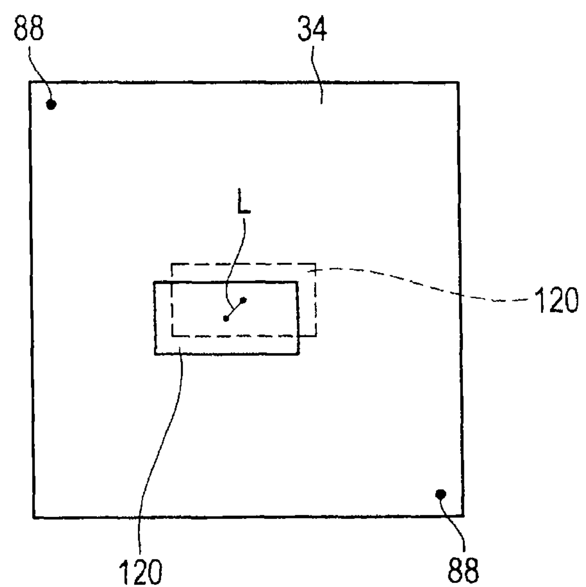
FIG. 9 is a diagram showing a deviation amount of a circuit board on which an LED element is mounted.

The mounting position of the LED element 120 detected in the inspection machine 152, that is, the position of the LED element 120 relative to a position of the circuit board 34 is a position of the LED element 120 shown with a solid line in FIG. 9, for example. Meanwhile, the predetermined mounting position of the LED element 120 is a position of the LED element 120 shown with a dotted line in FIG. 9. Accordingly, a deviation amount L between the mounting position (solid line) and the predetermined mounting position (dotted line) of the LED element 120 is acquired based on the two positions. When the deviation amount L is smaller than the threshold value $\alpha$, information indicating that the deviation amount L is a correction value, is transmitted to the controller 110 of the control device 102 of the mounting machine 14 from the controller of the control device of the inspection machine 152. Meanwhile, when the deviation amount L is equal to or greater than the threshold value $\alpha$, information indicating that the correction value is 0, is transmitted to the controller 110 of the control device 102 of the mounting machine 14 from the controller of the control device of the inspection machine 152.

When the mounting machine 14 receives the information relating to the correction value, the board position reference marks of the circuit board 34 are imaged and the positional information of the circuit board 34 is acquired. In the mounting machine 14, the lens 124 is mounted on the circuit board 34 based on the positional information of the circuit board 34 and the information relating to the correction value received from the inspection machine 152. That is, when the deviation amount L is smaller than the threshold value $\alpha$, the lens 124 is mounted in a position separated from the preset predetermined mounting position of the lens 124 by a distance corresponding to the deviation amount L. Accordingly, it is possible to make the light emitting unit of the LED element 120 coincide with the optical axis of the lens 124, and the LED lamp 126 having high quality is manufactured. Meanwhile, when the deviation amount L is equal to or greater than the threshold value $\alpha$, the correction amount is 0, and accordingly, the lens 124 is mounted in the preset predetermined mounting position of the lens 124. Therefore, it is possible to mount the lens 124 on the circuit board 34 so as not to make the lens protrude from the edge of the circuit board 34, and it is possible to decrease the percentage of defect of the LED lamp 126. As described above, in the mounting system 150, both the manufacturing of the LED lamp 126 having high quality and a decreased defect rate are realized.

In the mounting system 150, the deviation amount acquisition unit for acquiring the deviation amount described above is provided in the controller of the control device of the inspection machine 152. Meanwhile, the first lens mounting unit for mounting the lens 124 on the circuit board 34 when the deviation amount is smaller than the threshold value $\alpha$ and the second lens mounting unit for mounting the lens 124 on the circuit board 34 when the deviation amount is equal to or greater than the threshold value $\alpha$ are provided in the controller 110 of the control device 102 of the mounting machine 14.

In addition, in the example and the modification example described above, the mounting system 10 and the mounting system 150 are examples of the mounting system. The mounting machines 12 and 14, the wire bonding machine 16, and the inspection machine 152 are examples of a board operation execution machine. The control devices 100, 102, and 104 are examples of a control device. The LED element mounting unit 130, the deviation amount acquisition unit 132, the first lens mounting unit 134, the second lens mounting unit 136, the storage unit 138, and the lens non-mounting unit 140 are examples of an LED element mounting unit, a deviation amount acquisition unit, a first lens mounting unit, a second lens mounting unit, a storage unit, and a lens non-mounting unit. The circuit board 34, the LED element 120, and the lens 124 are examples of a board, an LED element, and a lens. The board position reference marks 88 and the element position reference marks 122 are examples of board position reference marks and element position reference marks.

The disclosure is not limited to the examples described above, and various modifications and improvements may be performed based on knowledge of a person skilled in the art. Specifically, in the examples, various commands and information items are transmitted and received between the control devices 100, 102, and 104. However, an overall control device which controls control devices collectively may be provided, and various commands and information items may be transmitted and received from the overall control device to the plurality of control devices 100, 102, and 104. In this case, the LED element mounting unit, the deviation amount acquisition unit, the first lens mounting unit, the second lens mounting unit, the storage unit, and the lens non-mounting unit are provided in the overall control device.

EXPLANATION OF REFERENCE

- 10: Mounting system
- 12: Mounting machine (board operation execution machine)
- 14: Mounting machine (board operation execution machine)
- 16: Wire bonding machine (board operation execution machine)
- 34: Circuit board (board)
- 88: Board position reference mark
- 100: Control device
- 102: Control device
- 104: Control device
- 120: LED element
- 122: Element position reference mark
- 124: Lens
- 130: LED element mounting unit
- 132: Deviation amount acquisition unit
- 134: First lens mounting unit
- 136: Second lens mounting unit
- 138: Storage unit
- 140: Lens non-mounting unit

The invention claimed is:

1. A mounting system which mounts an LED element on a board and mounts a lens so as to cover the LED element, the system comprising:

one or more board operation execution machines configured to execute an operation with respect to the board; and a control device configured to control the operation of the one or more board operation execution machines, wherein the control device includes an LED element mounting unit configured to control the one or more board operation execution machines to mount the LED element in a predetermined mounting position which is a preset position on the board, a deviation amount acquisition unit configured to acquire a deviation amount between a mounting position of the LED element mounted by the LED element mounting unit and the predetermined mounting position, a first lens mounting unit configured to control the one or more board operation execution machines to mount the lens on the board to cover the LED element using the mounting position of the LED element mounted on the board as a reference, when the deviation amount is smaller than a threshold value, and a second lens mounting unit different from the first lens mounting unit configured to control the one or more board operation execution machines to mount the lens in a preset position on the board to cover the LED element, regardless of the mounting position of the LED element mounted on the board, when the deviation amount is equal to or greater than the threshold value.

2. The mounting system according to claim 1, wherein the control device includes a lens non-mounting unit which does not mount the lens on the board, when the deviation amount is equal to or greater than a second threshold value which is set as a value greater than the threshold value.

3. The mounting system according to claim 2, wherein the first lens mounting unit mounts the lens on the board based on image data of element position reference marks marked on the LED element.

4. The mounting system according to claim 2, wherein the first lens mounting unit mounts the lens on the board based on image data of board position reference marks marked on the board and the deviation amount.

5. The mounting system according to claim 2, wherein the control device includes a storage unit which separately stores a board on which the lens is mounted by the first lens mounting unit, and a board on which the lens is mounted by the second lens mounting unit.

6. The mounting system according to claim 1, wherein the first lens mounting unit mounts the lens on the board based on image data of element position reference marks marked on the LED element.

7. The mounting system according to claim 6, wherein the control device includes a storage unit which separately stores a board on which the lens is mounted by the first lens mounting unit, and a board on which the lens is mounted by the second lens mounting unit.

8. The mounting system according to claim 1, wherein the first lens mounting unit mounts the lens on the board based on image data of board position reference marks marked on the board and the deviation amount.

9. The mounting system according to claim 8, wherein the control device includes a storage unit which separately stores a board on which the lens is mounted by the first lens mounting unit, and a board on which the lens is mounted by the second lens mounting unit.

10. The mounting system according to claim 1, wherein the control device includes a storage unit which separately stores a board on which the lens is mounted by the first lens mounting unit, and a board on which the lens is mounted by the second lens mounting unit.

* * * * *